United States Patent
Komiyama et al.

(10) Patent No.: US 6,724,905 B2
(45) Date of Patent: Apr. 20, 2004

(54) MICROPHONE UNIT MOUNTING STRUCTURE

(75) Inventors: Takehiko Komiyama, Kanagawa (JP); Mitsuru Kuroda, Tokyo (JP)

(73) Assignee: NEC Corporation, Tokyo (JP)

( * ) Notice: Subject to any disclaimer, the term of this patent is extended or adjusted under 35 U.S.C. 154(b) by 77 days.

(21) Appl. No.: 10/095,486

(22) Filed: Mar. 13, 2002

(65) Prior Publication Data

US 2002/0131615 A1 Sep. 19, 2002

(30) Foreign Application Priority Data

Mar. 16, 2001 (JP) ............................. 2001-076565

(51) Int. Cl.[7] .............................................. H04R 11/04
(52) U.S. Cl. ..................... 381/365; 381/355; 455/90
(58) Field of Search ............................ 381/355, 361, 381/368, 369, 353, 365; 181/138, 158; 455/90, 550, 575

(56) References Cited

U.S. PATENT DOCUMENTS

| | | | | |
|---|---|---|---|---|
| 4,675,903 A | * | 6/1987 | Gulezian et al. | 379/433.03 |
| 5,836,790 A | * | 11/1998 | Barnett | 439/620 |
| 6,038,328 A | * | 3/2000 | Hsu | 381/361 |
| 6,370,362 B1 | * | 4/2002 | Hansen et al. | 455/90.1 |
| 6,549,636 B2 | * | 4/2003 | Fujimoto et al. | 381/368 |

FOREIGN PATENT DOCUMENTS

| | | | |
|---|---|---|---|
| EP | 0 774 888 A2 | 5/1997 | H05K/1/18 |
| EP | 0 774 888 A3 | 10/1998 | H05K/1/18 |
| GB | 2 064 264 A | 6/1981 | H04M/1/62 |
| JP | 11-41683 | 2/1999 | H04R/1/02 |
| JP | 11-195927 | 7/1999 | H03B/5/32 |

* cited by examiner

*Primary Examiner*—Curtis Kuntz
*Assistant Examiner*—Brian Ensey
(74) *Attorney, Agent, or Firm*—McGinn & Gibb, PLLC

(57) ABSTRACT

The invention provides a microphone unit mounting structure wherein the thickness of a body typically of a portable telephone set can be reduced without being restricted by the dimension of the sum of the height of a microphone and the thickness of a microphone connector and a printed circuit board. The microphone unit mounting structure includes a microphone connector electrically connected to the microphone, a microphone holder for holding the microphone together with the microphone connector thereon to form a microphone unit, and a printed circuit board. The microphone connector has a projecting portion projecting outwardly therefrom farther than an outer peripheral edge of the microphone and electrically connected to the printed circuit board. The printed circuit board has a microphone unit relief hole formed therein, and the microphone unit is held on the front case of the body member in such a state that part of the microphone unit is received in the microphone unit relief hole.

20 Claims, 12 Drawing Sheets

US 6,724,905 B2

MICROPHONE UNIT MOUNTING STRUCTURE

BACKGROUND OF THE INVENTION

1. Field of the Invention

The present invention relates to a microphone unit mounting structure, for example, for a portable telephone set wherein a microphone of a small size is formed as a unit together with a holder therefor and mounted in the inside of a body of the portable telephone set.

2. Description of the Related Art

Conventionally, in order to mount a microphone for a portable telephone set or the like, various mounting methods such as a method wherein a microphone itself is soldered to a printed circuit board or another method wherein a microphone is secured to a front case of a body of the portable telephone set or the like and leads from the microphone are soldered to a printed circuit board are used to electrically connect the microphone and the printed circuit board to each other.

However, in recent years, as a portable telephone set exhibits remarkable popularization, also the number of manufactured units exhibits a remarkable increase. Therefore, various mounting structures and connection methods for a microphone which achieve augmentation of the production efficiency have been proposed. Typical mounting structures and connection methods are described below.

FIGS. 10 and 11 show one of such conventional mounting structures for a microphone as described above. Referring to FIGS. 10 and 11, a disk-shaped microphone 101 is fitted in a microphone holder 102 made of rubber and having a ring shape with a flange, and a microphone connector 103 of conductive rubber is placed on one face of the microphone 101 to form a microphone unit 104. The microphone holder 102 is force fitted in a microphone unit force fit rib 106 provided on an inner face of a front case 105 of a body typically of a portable telephone set to secure the microphone unit 104 to the front case 105. The microphone connector 103 contacts under pressure with a printed circuit board 107 (to make the microphone connector 103 of conductive rubber collapse) to electrically connect the microphone 101 and the printed circuit board 107 to each other. A sound passing hole 108 is formed in the front case 105.

FIGS. 12 and 13 show another mounting structure for a microphone. Referring to FIGS. 12 and 13, a disk-shaped microphone 201 is placed on a microphone connector 202 with spring terminals and fitted in a microphone holder 203 made of rubber to form a microphone unit 204. The microphone holder 203 is force fitted in a microphone unit force fit rib 206 provided on an inner face of a front case 205 of a body typically of a portable telephone set to secure the microphone unit 204 to the front case 205. Spring terminals 202a of the connector 202 contact under pressure with a printed circuit board 207 (to deform the spring terminals 202a) to electrically connect the microphone 201 and the printed circuit board 207 to each other. A sound passing hole 208 is formed in the front case 205.

However, since reduction in size and weight has proceeded with portable telephone sets in recent years, and also from a reason that, particularly with portable telephone sets of the foldable type, it has become a requirement that a display section has an increasingly large screen, there is a tendency that the thickness of the portable telephone set when it is folded around a hinge member such that upper and lower portions of the body are overlapped with each other is reduced because there is a limitation to reduction of the width and the length of the body.

However, in the conventional microphone unit mounting structures described above, a microphone connector is placed on one face of a microphone and is held between the microphone and a printed circuit board to establish electric connection between the microphone and the printed circuit board. Therefore, a space in which the microphone connector is to be accommodated is required in addition to the thickness of the microphone between the front case and the printed circuit board. Further, as the thickness of the body, the sum of the thickness of the microphone, the thickness of the connector and the thickness of the printed circuit are required with certainty.

Accordingly, in order to reduce the thickness of the body of the portable telephone set, it is necessary to reduce the thickness of each of the parts such as the microphone and the microphone connector. In other words, the conventional microphone unit mounting structures described above has a problem in that, from a restriction to the dimension of the sum of the thickness of the microphone and the thickness of the microphone connector and the printed circuit board, the thickness of the body cannot be reduced.

SUMMARY OF THE INVENTION

It is an object of the present invention to provide a microphone unit mounting structure wherein the thickness of a body of a portable telephone set or the like can be reduced without being restricted by the dimension of the sum of the height of a microphone and the thickness of a microphone connector and a printed circuit board.

In order to attain the object described above, according to the present invention, there is provided a microphone unit mounting structure for mounting a microphone on a body member having a front case, comprising a microphone connector electrically connected to the microphone, a microphone holder for holding the microphone together with the microphone connector thereon to form a microphone unit, and a printed circuit board, the microphone connector having a projecting portion projecting outwardly therefrom farther than an outer peripheral edge of the microphone and electrically connected to the printed circuit board, the printed circuit board having a microphone unit relief hole formed therein, the microphone unit being held on the front case of the body member in such a state that part of the microphone unit is received in the microphone unit relief hole.

With the microphone unit mounting structure, the microphone connector and the printed circuit board are connected to each other at a location spaced away from the microphone and the thickness of part of the microphone unit can be relieved by the microphone unit relief hole of the printed circuit board. Therefore, the distance between the printed circuit board and the inner face of the front case can be confined within the range of the thickness of the microphone. Further, the installation thickness of the printed circuit board remains within the range of the thickness of the microphone unit, and also the installation thickness of the electric connection portion between the microphone connector and the printed circuit board remains within the range of the thickness of the microphone unit. Therefore, the body member can be formed with a small thickness.

Preferably, the projecting portion of the microphone connector includes a spring terminal. With the microphone unit mounting structure, the electric connection can be established through the spring without using solder. In this instance, preferably the microphone holder has a terminal stopper projecting outwardly therefrom such that deformation of the spring terminal of the microphone connector by more than a predetermined amount can be restricted by the terminal stopper. With the microphone unit mounting structure, an inclination of the spring terminal which occurs with respect to the printed circuit board can be suppressed, and consequently, a stabilized electric connection state can be maintained. Further, the spring terminal can be protected to prevent deformation of or damage to the spring terminal upon assembly.

Alternatively, the projecting portion of the microphone connector may be electrically connected to the printed circuit board through a conductive rubber connector. Also with the microphone unit mounting structure, the electric connection can be established through the spring without using solder.

Preferably, the front case has a microphone unit force fitting rib formed on an inner face thereof, and the microphone unit is force fitted in the microphone unit force fitting rib to hold the microphone unit on the front case. With the microphone unit mounting structure, the microphone unit can be mounted simply.

Preferably, the microphone unit is held down by a holding down plate from the opposite side of the front case together with the printed circuit board to secure the microphone unit to the front case together with the printed circuit board. With the microphone unit mounting structure, the mounting structure is tough against an impact.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENTS

Figure 1:
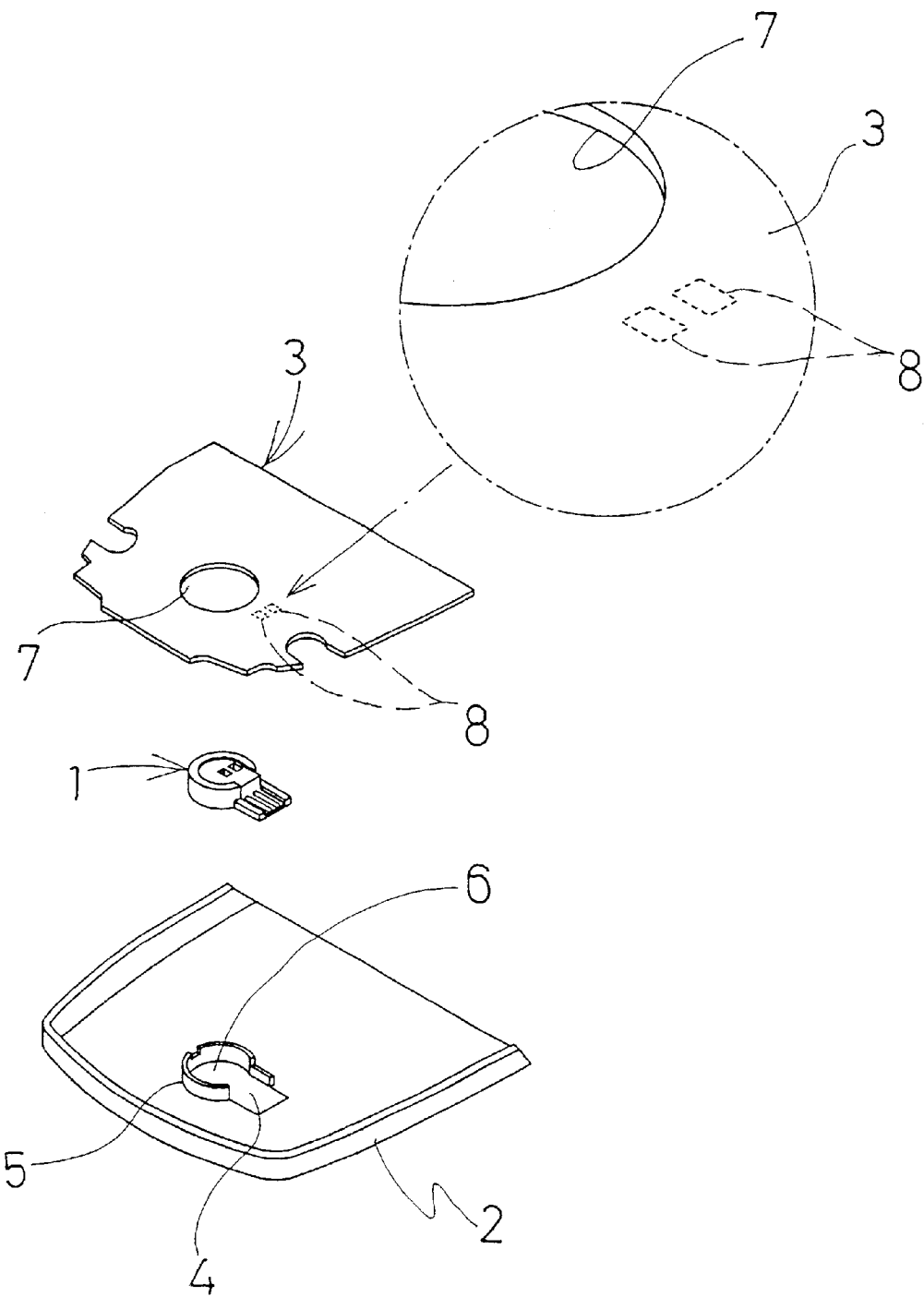
FIG. 1 is an exploded perspective view of a microphone unit mounting structure to which the present invention is applied.

Referring first to FIG. 1, there is shown a microphone unit mounting structure to which the present invention is applied. The microphone unit mounting structure includes a microphone unit 1, a front case 2 of a body of a portable telephone set, and a printed circuit board 3.

A microphone unit fitting recess 4 having a rectangular shape at a front portion and a circular shape at a rear portion thereof is formed on an inner face of the front case 2. A substantially circular microphone unit force fit rib 5 which conforms with an outer profile of the microphone unit 1 is formed uprightly along a circumferential edge of the microphone unit fitting recess 4, and a sound passing hole 6 is formed at the center of the microphone unit fitting recess 4 in the front case 2.

A substantially circular microphone unit relief hole 7 which conforms with the outer profile of the microphone unit 1 is provided in the printed circuit board 3, and a pair of spring terminal contact portions (lands) 8 are formed in the proximity of the microphone unit relief hole 7 on the printed circuit board 3.

Figure 2A:
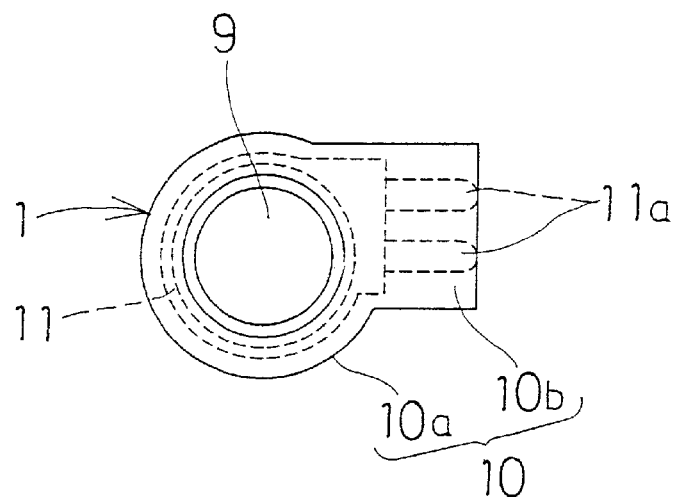
FIGS. 2(A), 2(B) and 2(C) are a plan view, across sectional view and a rear elevational view of a microphone unit shown in FIG. 1, respectively.
Figure 2B:
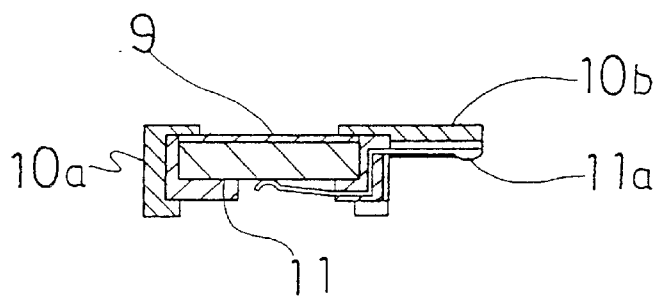
Figure 2C:
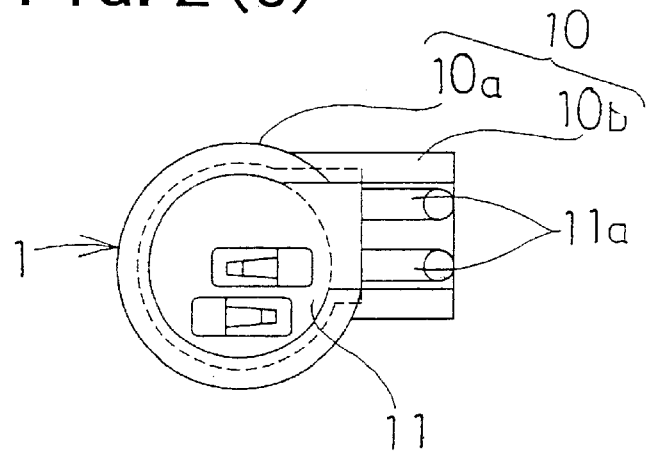

Referring now to FIGS. 2(A), 2(B) and 2(C), the microphone unit 1 includes a disk-shaped microphone 9, a microphone holder 10 made of rubber, and a microphone connector 11 having a pair of spring terminals 11a made of metal. The microphone holder 10 has a microphone connector fitting portion 10a in the form of a ring with a flange and a plate-shaped terminal stopper 10b integral with and extending outwardly from the microphone connector fitting portion 10a. The microphone connector 11 embraces the microphone 9 and electrically connects the spring terminals Ha to the microphone 9. The microphone connector 11 which embraces the microphone 9 is fitted in the microphone connector fitting portion 10a of the microphone holder 10 to form the microphone unit 1. The spring terminals 11a extend along grooves 10c formed on the terminal stopper 10b and are protected by the terminal stopper 10b.

Figure 3:
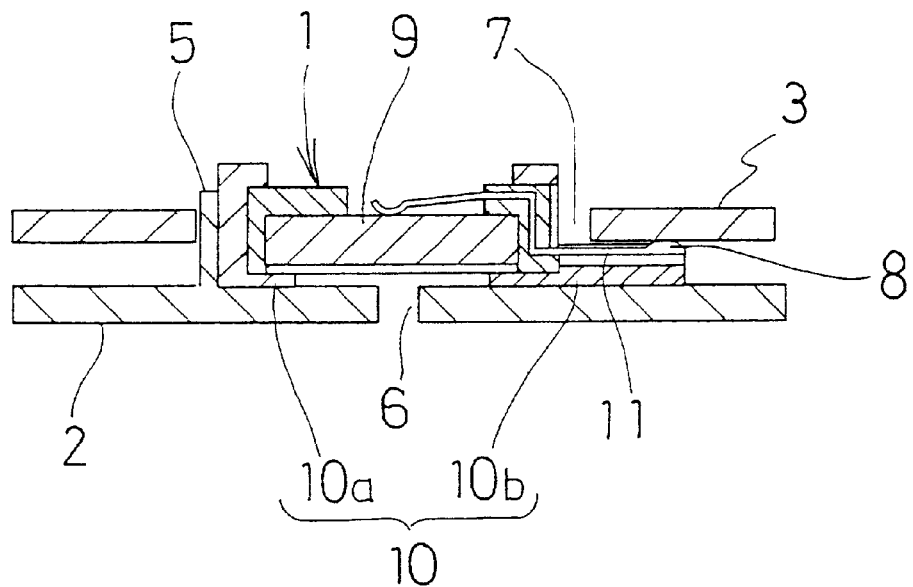
FIG. 3 is an enlarged cross sectional view particularly showing of the microphone unit mounting structure of FIG. 1.

The microphone unit 1 having the configuration described above is mounted onto the front case 2 by force fitting it into the microphone unit force fit rib 5 of the front case 2 and securing the printed circuit board 3 to the front case 2 as shown in FIG. 3. In this mounted state, the sound passing hole 6 of the front case 2 is positioned in the proximity of and in an opposing relationship to a central portion of the microphone 9, and the circular portion of the microphone unit 1 force fitted in the microphone unit force fit rib 5 is received in enters the microphone unit relief hole 7 of the printed circuit board 3 together with part of the microphone unit force fit rib 5. Further, the terminal stopper 10b is positioned between the printed circuit board 3 and the front case 2 together with the spring terminals 11a, and the spring terminals 11a contact under pressure with the spring terminal contact portions (lands) 8 of the printed circuit board 3.

Accordingly, when the necessary thickness of the body of the portable telephone set is considered, the installation thickness of the printed circuit board 3 remains within the range of the thickness of the microphone unit 1, and also the installation thickness where the terminal stopper 10b, the spring terminals 11a and the spring terminal contact portions 8 of the printed circuit board 3 are overlapped with each other remains within the range of the thickness of the microphone unit 1. Therefore, the body can be formed with a small thickness. Further, the microphone unit 1 can be mounted simply only by force fitting thereof into the microphone unit force fit rib 5 and can be electrically connected to the printed circuit board 3 without using solder.

Further, since the spring terminals Ha are held between the terminal stopper 10b and the printed circuit board 3, the moment (inclination) of the spring terminals 11a which appears with respect to the printed circuit board 3 can be suppressed, and consequently, a stabilized electric connection condition can be maintained. Further, since the spring terminals 11a can be protected by the terminal stopper 10b, there is no possibility that, upon assembly, the spring terminals Ha may be caught and deformed or broken in error by a hand.

Figure 4:
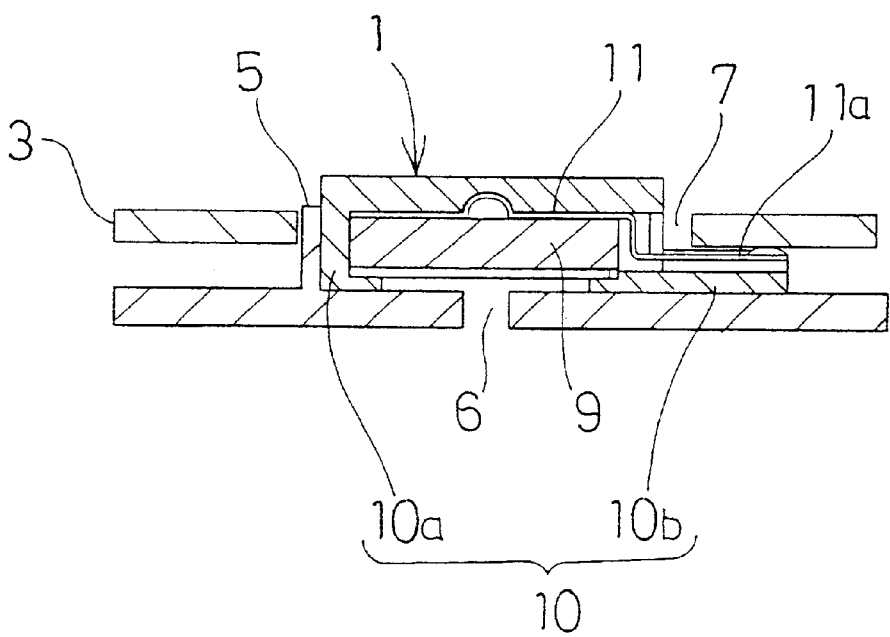
FIG. 4 is a similar view to FIG. 3 but showing a modified microphone unit mounting structure.

FIG. 4 shows a modification to the microphone unit mounting structure described above with reference to FIGS. 1 to 3. Referring to FIG. 4, in the modified microphone unit mounting structure, the microphone connector 11 does not embrace the microphone 9 but is configured so as to have a structure integrated with the spring terminals 11a formed from a thin metal plate.

Figure 5:
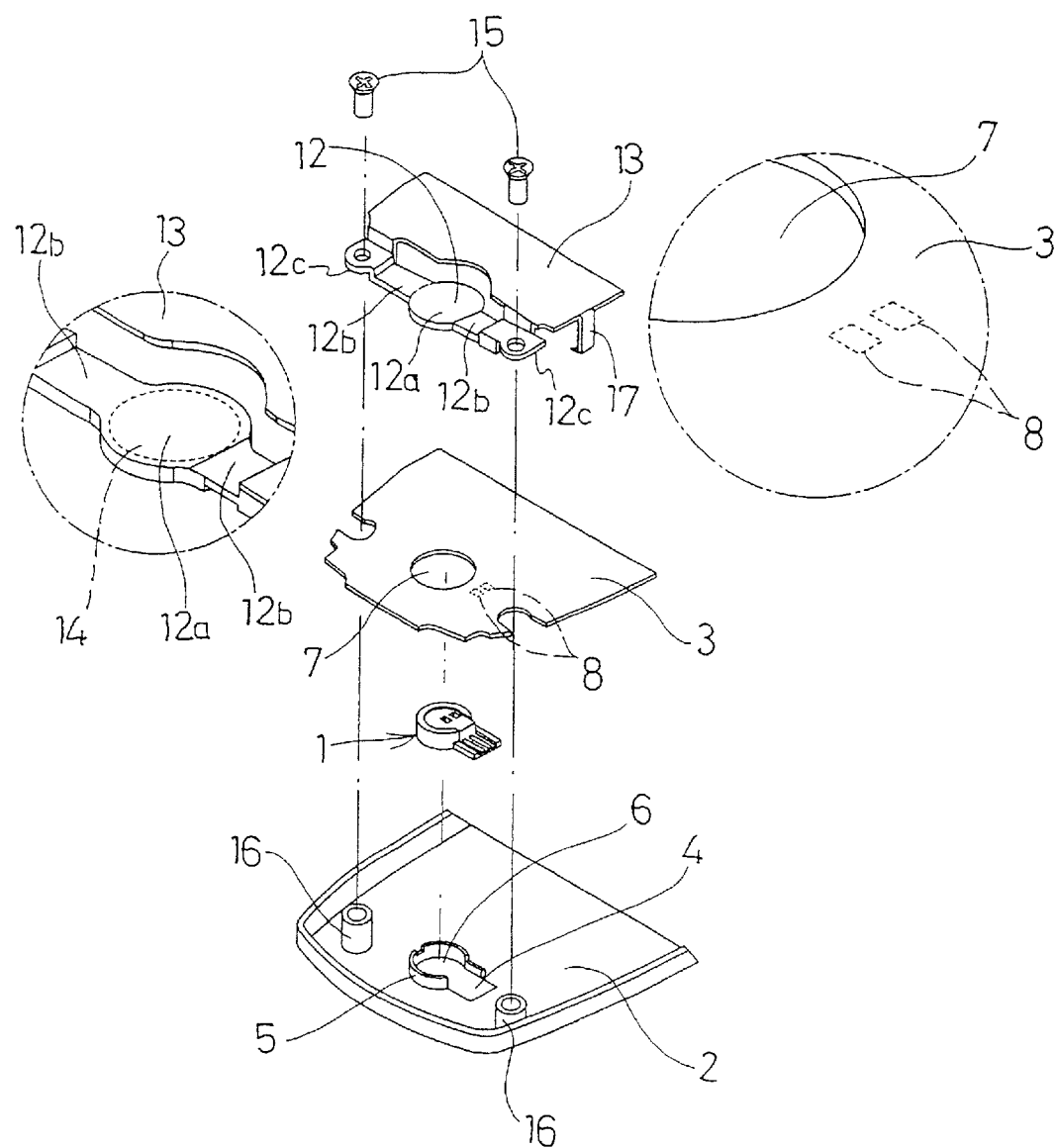
FIG. 5 is an exploded perspective view of another microphone unit mounting structure to which the present invention is applied.
Figure 6:
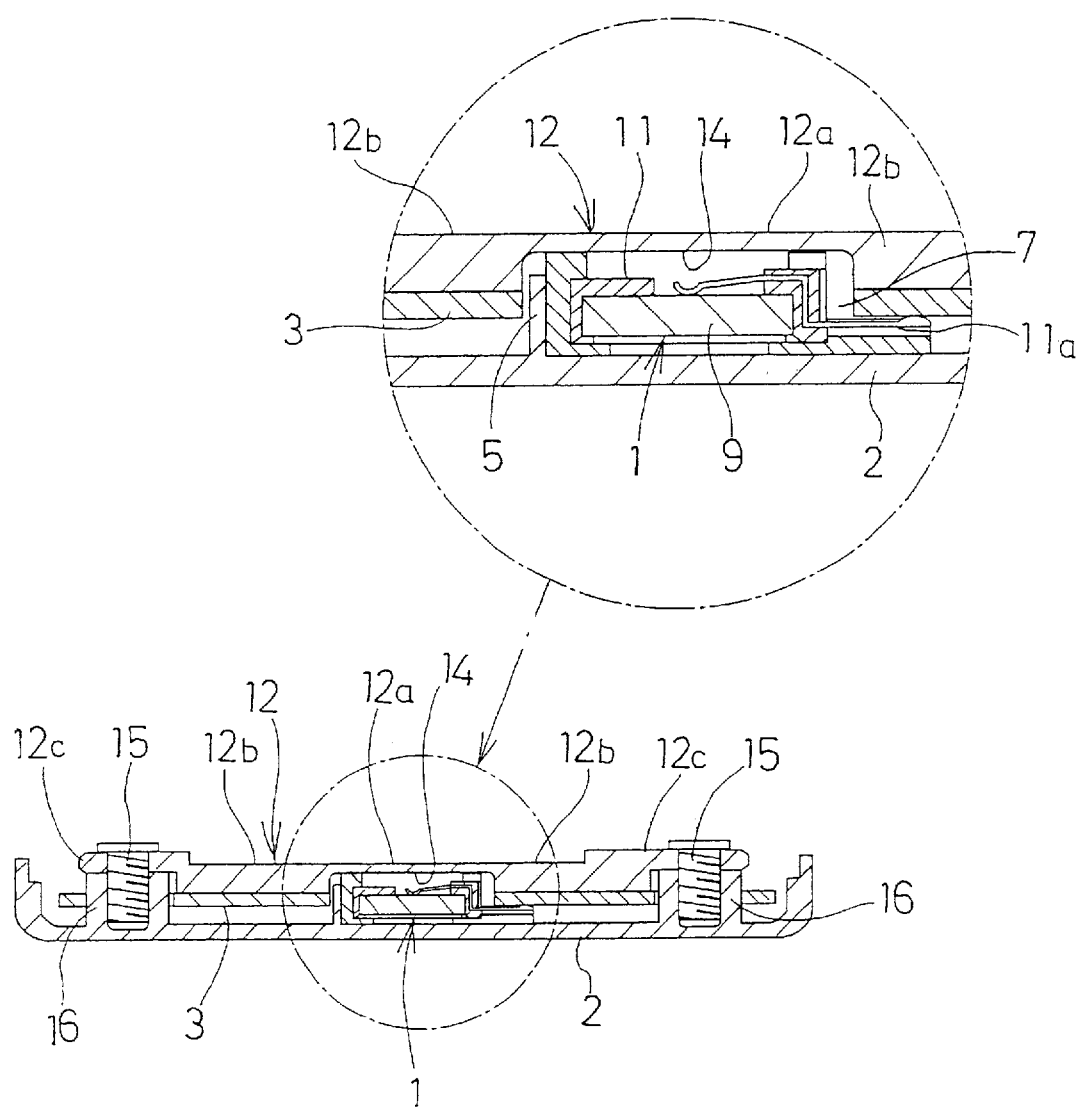
FIG. 6 is a cross sectional view of the microphone unit mounting structure of FIG. 5.

Referring now to FIGS. 5 and 6, there is shown another microphone unit mounting structure to which the present invention is applied. The microphone unit mounting structure of the present embodiment is a modification to and includes similar components to those of the microphone unit mounting structure of the first embodiment described hereinabove with reference to FIGS. 1 to 3. The microphone unit mounting structure of the present embodiment is different from that of the first embodiment in that it additionally includes a holding down plate 12 and the microphone unit 1 is held down together with the printed circuit board 3 by the holding down plate 12 in the following manner to secure the microphone unit 1.

The holding down plate 12 is formed integrally with a frame plate 13 located in the inside of the body of the portable telephone set. The holding down plate 12 has a microphone unit holding down portion 12a having a circular recess 14 formed thereon which has a size equal to that of the microphone unit relief hole 7 of the printed circuit board 3, a pair of printed circuit board holding down portions 12b on the opposite sides of the microphone unit holding down portion 12a, and a pair of screw fastening portions 12c at the opposite ends of the printed circuit board holding down portions 12b. The printed circuit board holding down portions 12b at the opposite ends of the holding down plate 12 are fastened to threaded bosses 16 of the front case 2 using screws 15 such that the microphone unit 1 is held down by the microphone unit holding down portion 12a in a state wherein part of the microphone unit 1 is received in the circular recess 14 and the printed circuit board 3 is held down by the printed circuit board holding down portions 12b on the opposite sides of the microphone unit holding down portion 12a to secure the microphone unit 1 and the printed circuit board 3 as shown in FIG. 6.

A pair of securing hooks 17 are provided in a projecting manner at the right angle on the opposite side edges of the frame plate 13 as seen in FIG. 5. The securing hooks 17 are engaged with the opposite side edges of the printed circuit board 3 to secure also the frame plate 13 to the printed circuit board 3.

Figure 7:
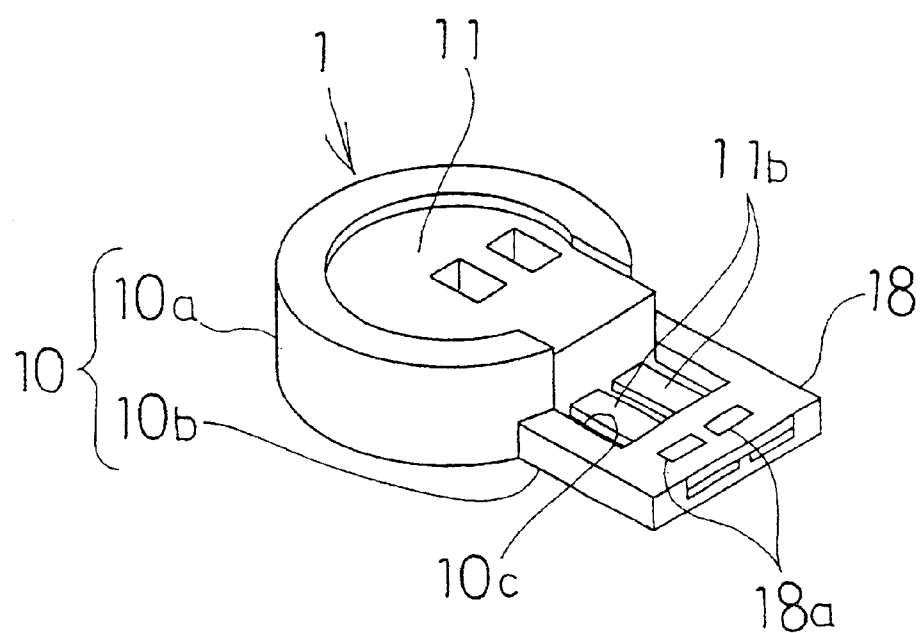
FIG. 7 is a perspective view of a microphone unit used in a further microphone unit mounting structure to which the present invention is applied.
Figure 8A:
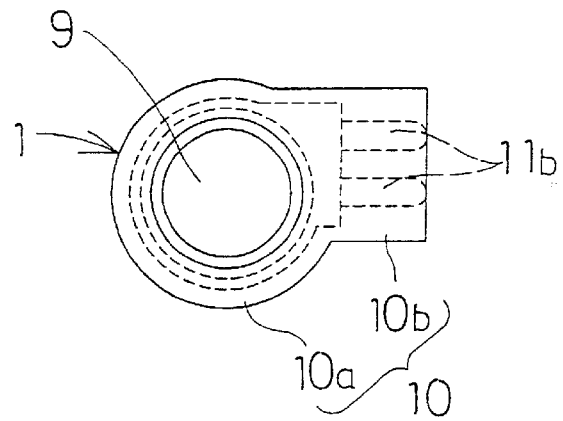
FIGS. 8(A), 8(B) and 8(C) are a plan view, a sectional view and a rear elevational view of the microphone unit of FIG. 7, respectively.
Figure 8B:
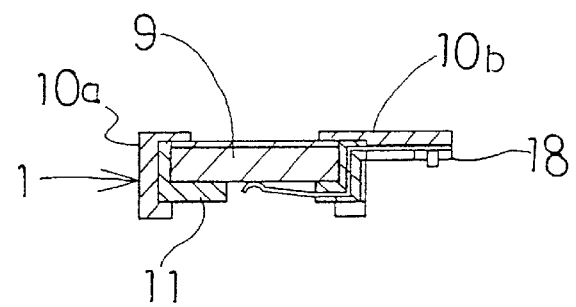
Figure 8C:
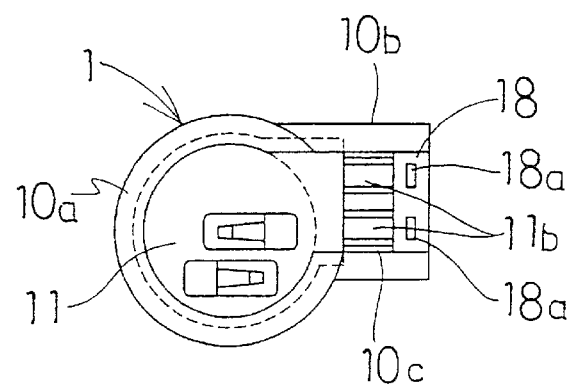
Figure 9:
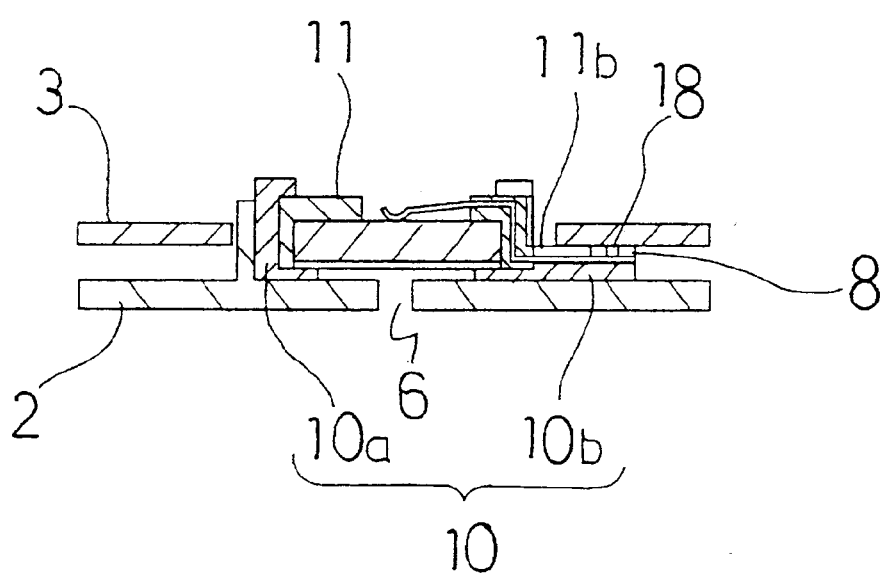
FIG. 9 is a cross sectional view of the microphone unit mounting structure which uses the microphone unit of FIG. 7.
Figure 10A:
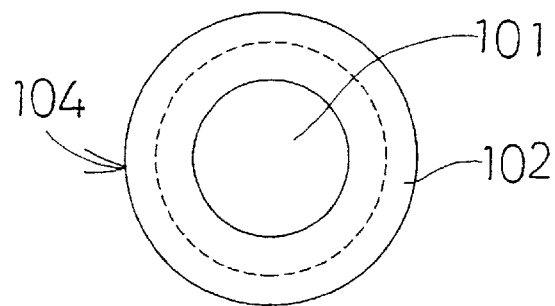
FIGS. 10(A), 10(B) and 10(C) of FIG. 10 are a plan view, a sectional view and a rear elevational view of a microphone unit used in a conventional microphone unit mounting structure, respectively.
Figure 10B:
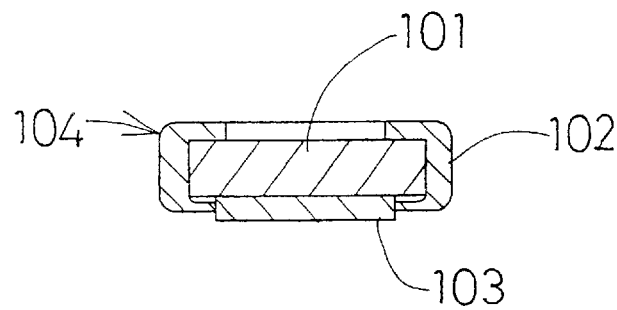
Figure 10C:
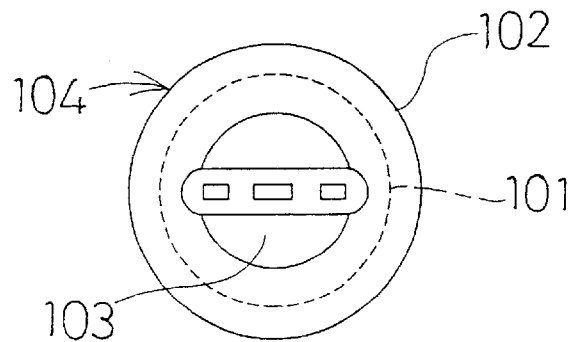
Figure 11:
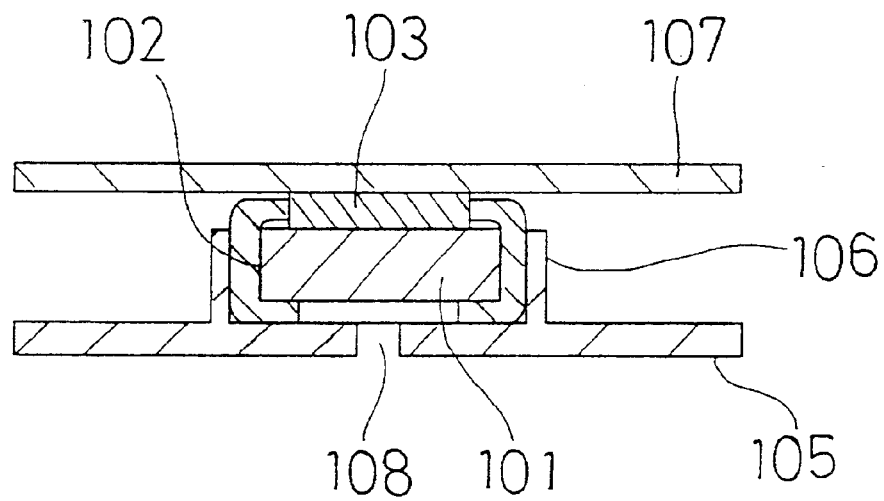
FIG. 11 is a cross sectional view of the microphone unit mounting structure which uses the microphone unit of FIGS. 10(A), 10(B) and 10(C)
Figure 12A:
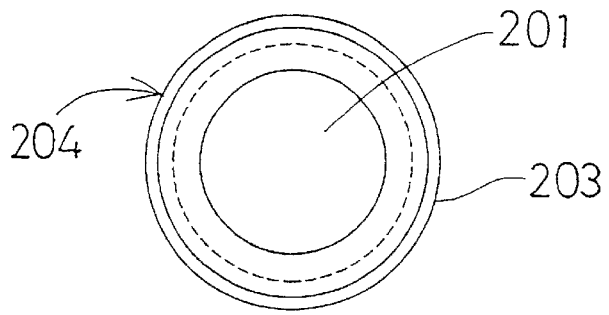
FIGS. 12(A), 12(B) and 12(C) are a plan view, a sectional view and a rear elevational view of a microphone unit used in another conventional microphone unit mounting structure, respectively.
Figure 12B:
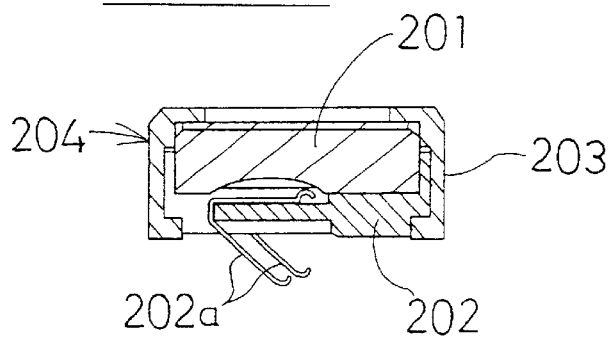
Figure 12C:
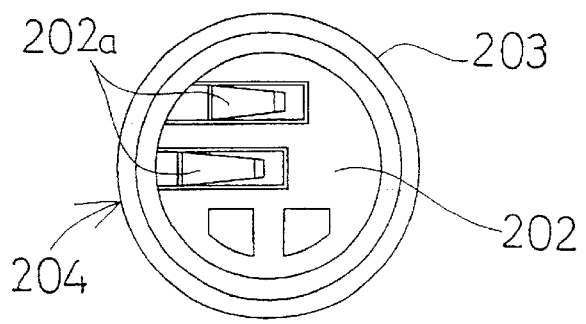
Figure 13:
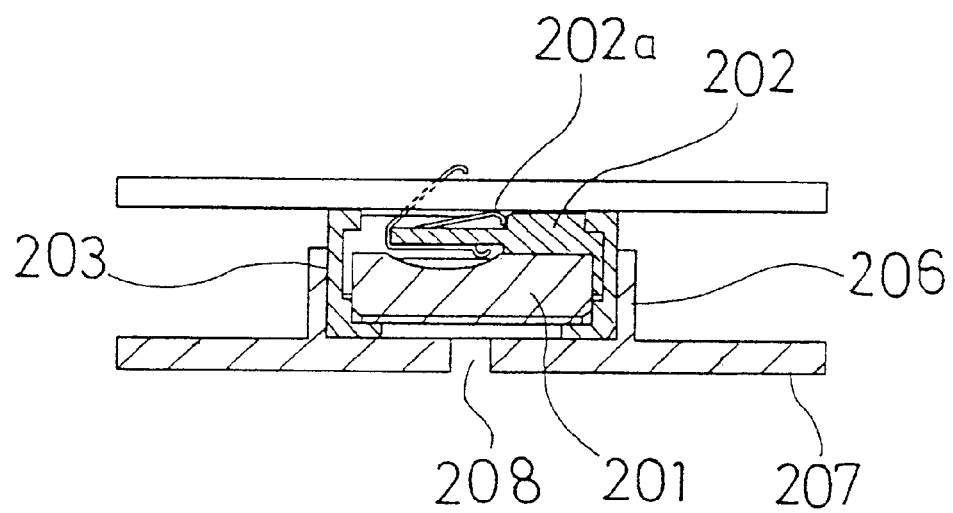
FIG. 13 is a cross sectional view of the microphone unit mounting structure which uses the microphone unit of FIGS. 12(A), 12(B) and 12(C).

FIGS. 7 to 9 show a further microphone unit mounting structure to which the present invention is applied. Referring to FIGS. 7 to 9, the microphone unit mounting structure of the present embodiment is a modification to and includes similar components to those of the microphone unit mounting structure of the first embodiment described hereinabove with reference to FIGS. 1 to 3. The microphone unit mounting structure of the present embodiment is different from that of the first embodiment in that the spring terminals 11a of the microphone connector 11 in the first embodiment shown in FIGS. 1 to 3 are replaced by a pair of conductive terminals 11b extending integrally from the microphone connector 11 and a conductive rubber connector 18 in which end portions of the conductive terminals 11b are embedded. A pair of conducting portions 18a of the conductive rubber connector 18 are exposed to the surface of the conductive rubber connector 18.

Although the mounting structure of the third embodiment uses the microphone connector 11 of the modified form just described, as seen in FIG. 9, it is similar to the first embodiment in that the sound passing hole 6 of the front case 2 is located in the proximity of and in an opposing relationship to a central portion of the microphone 9, that the circular portion of the microphone unit 1 force fitted in the microphone unit force fit rib 5 is received the microphone unit relief hole 7 of the printed circuit board 3 together with the microphone unit force fit rib 5, and that the terminal stopper 10b is positioned between the printed circuit board 3 and the front case 2 together with the spring terminals 11a. However, the conducting portions 18a of the conductive rubber connector 18 contact under pressure with the spring terminal contact portions (lands) 8 of the printed circuit board 3 in a state wherein the conductive rubber connector 18 is compressed.

While preferred embodiments of the present invention have been described using specific terms, such description is for illustrative purposes only, and it is to be understood that changes and variations may be made without departing from the spirit or scope of the following claims.

What is claimed is:

1. A microphone unit mounting structure for mounting a microphone on a body member, comprising:

a microphone connector electrically connected to said microphone;

a microphone holder for holding said microphone together with said microphone connector thereon to form a microphone unit; and a printed circuit board, wherein said microphone connector comprises a projecting portion projecting outwardly therefrom farther than an outer peripheral edge of said microphone and electrically connected to said printed circuit board, at least a portion of said projecting portion being formed between said printed circuit board and said microphone holder, wherein said printed circuit board comprises a microphone unit relief hole formed therein; and wherein said microphone unit is held on a front case of said body member such that part of said microphone unit is received in said microphone unit relief hole.

2. The microphone unit mounting structure as claimed in claim 1, wherein said projecting portion of said microphone connector includes a spring terminal.

3. The microphone unit mounting structure as claimed in claim 2, wherein said microphone holder comprises a terminal stopper projecting outwardly therefrom such that deformation of said spring terminal of said microphone connector by more than a predetermined amount is restricted by said terminal stopper.

4. The microphone unit mounting structure for mounting a microphone on a body member as claimed in claim 1, wherein said projecting portion of said microphone connector is electrically connected to said printed circuit board through a conductive rubber connector.

5. The microphone unit mounting structure for mounting a microphone on a body member as claimed in claim 1, wherein said front case includes a microphone unit force fitting rib formed on an inner face of said front case, and said microphone unit is force fitted in said microphone unit force fitting rib to hold said microphone unit on said front case.

6. The microphone unit mounting structure for mounting a microphone on a body member as claimed in claim 1, wherein said microphone unit is held down by a holding down plate from the opposite side of said front case together with said printed circuit board to secure said microphone unit to said front case together with said printed circuit board.

7. The microphone unit mounting structure according to claim 1, wherein said microphone holder directly contacts said microphone.

8. The microphone unit mounting structure according to claim 1, wherein said microphone connector is fitted in said microphone connector fitting portion of said microphone holder to form said microphone unit.

9. The microphone unit mounting structure according to claim 2, wherein said microphone holder comprises a terminal stopper portion, said terminal stopper portion is positioned between said printed circuit board and said front case together with said spring terminal to form an overlap portion.

10. The microphone unit mounting structure according to claim 9, further comprising:
   an acoustic port situated adjacent to said terminal stopper portion of said microphone holder.

11. The microphone unit mounting structure according to claim 1, wherein said projecting portion is formed on said microphone holder.

12. The microphone unit mounting structure according to claim 9, wherein said microphone unit has a thickness greater than a thickness of said overlap portion.

13. The microphone unit mounting structure according to claim 1, wherein said microphone connector further comprises a thin plate, which is integrally formed with said projecting portion.

14. The microphone unit mounting structure according to claim 1, further comprising:
   a holding plate to hold together said printed circuit board and said microphone unit.

15. The microphone unit mounting structure according to claim 1, wherein said projecting portion comprises a pair of conductive terminals integrally formed with and extended from said microphone connector, and
   wherein said conductive terminals comprise end portions embedded in a conductive connector.

16. A microphone unit mounting structure for mounting a microphone on a front case of a body member, comprising:
   a printed circuit board;
   a microphone connector electrically connecting said microphone to said printed circuit board;
   a microphone holder comprising a microphone holding portion for holding said microphone together with said microphone connector to form a microphone unit,
      wherein said microphone unit is mounted on said front case of said body member,
      wherein said microphone holder comprises a plate-shaped terminal stopper, which is formed integrally with and extends outwardly from said microphone holding portion,
      wherein said microphone connector comprises a terminal extending to and on said plate-shaped terminal stopper, and said printed circuit board includes a microphone unit relief hole,
      wherein said printed circuit board includes a terminal contact portion provided around said microphone unit relief hole,
      wherein said microphone holding portion of said microphone holder is received in said microphone unit relief hole while said terminal of said microphone connector is held in contact with said terminal contact portion between said terminal stopper and said printed circuit board.

17. The microphone unit mounting structure according to claim 16, wherein said terminal of said microphone connector comprises a spring terminal, said spring terminal contacts under pressure with said terminal contact portion of said printed circuit board.

18. The microphone unit mounting structure according to claim 16, wherein said plate-shaped terminal stopper comprises a rubber material, and
   wherein said terminal of said microphone connector contacts under pressure with said terminal contact portion of said printed circuit board by resiliency of said plate-shaped terminal stopper.

19. The microphone unit mounting structure according to claim 16, wherein said front case comprises a microphone unit force fitting rib formed on an inner face thereof, and
   wherein said microphone unit is force fitted in said microphone unit force fitting rib to hold said microphone unit on said front case.

20. The microphone unit mounting structure according to claim 16, wherein said microphone unit is held down by a holding down plate from an opposite side of said front case together with said printed circuit board to secure said microphone unit to said front case together with said printed circuit board.

* * * * *